US009011069B2

(12) United States Patent
Lee

(10) Patent No.: US 9,011,069 B2
(45) Date of Patent: Apr. 21, 2015

(54) GLASS SUBSTRATE TRANSPORTING APPARATUS

(75) Inventor: Yi-Lung Lee, Taichung (TW)

(73) Assignee: Tera Autotech Corporation, Taichung (TW)

( * ) Notice: Subject to any disclaimer, the term of this patent is extended or adjusted under 35 U.S.C. 154(b) by 358 days.

(21) Appl. No.: 13/356,074

(22) Filed: Jan. 23, 2012

(65) Prior Publication Data

US 2013/0186298 A1 Jul. 25, 2013

(51) Int. Cl.
*B65G 1/00* (2006.01)
*C03B 35/20* (2006.01)
*H01L 21/673* (2006.01)
*H01L 21/677* (2006.01)
*C03B 35/14* (2006.01)

(52) U.S. Cl.
CPC .......... *C03B 35/202* (2013.01); *H01L 21/6734* (2013.01); *H01L 21/67742* (2013.01); *H01L 21/67748* (2013.01); *C03B 35/14* (2013.01)

(58) Field of Classification Search
USPC ............... 414/277, 279, 280, 222.07, 222.08, 414/222.13, 226.03, 226.05
See application file for complete search history.

(56) References Cited

U.S. PATENT DOCUMENTS

| 6,039,259 A * | 3/2000 | Mattson ........................ 235/475 |
| 2007/0031219 A1* | 2/2007 | Besch ........................... 414/277 |
| 2011/0038692 A1* | 2/2011 | Hofmeister et al. .......... 414/217 |

* cited by examiner

*Primary Examiner* — Saul Rodriguez
*Assistant Examiner* — Willie Berry, Jr.
(74) *Attorney, Agent, or Firm* — Muncy, Geissler, Olds & Lowe, P.C.

(57) ABSTRACT

A glass substrate transporting apparatus aims to load or unload a quartz bracket into or from multiple reactors. It includes a track, a carriage, a rotary element and a telescopic fetching rack. The reactors are located at two sides of the track. The carriage has four track wheels movable on the track and multiple motors to synchronously drive the four track wheels. The rotary element is located on the carriage. The telescopic fetching rack is located on the rotary element. Through movement of the carriage on the track and rotation of the rotary element, the telescopic fetching rack can sequentially align and enter the reactors to load or unload the quartz bracket, thus amount of the reactors to be utilized is increased and utilization efficiency of the glass substrate transporting apparatus is improved. Moreover, as the carriage can move quickly on the track, production is also increased.

6 Claims, 9 Drawing Sheets

GLASS SUBSTRATE TRANSPORTING APPARATUS

FIELD OF THE INVENTION

The present invention relates to a solar power fabrication apparatus and particularly to a transporting apparatus for a quartz bracket holding a glass substrate.

BACKGROUND OF THE INVENTION

Solar power generation is a renewable energy source of great potential. It can significantly reduce carbon emission and gets increasing attention. However, due to physical limitation the efficiency of solar power generation is still not desirable to date, and the cost of solar power generation remains very high. How to reduce the cost of solar power generation is a main focus of solar power development at present.

FIG. 1 illustrates a conventional solar power producing equipment. It includes a glass substrate transporting apparatus 1 to load a quartz bracket 2 holding a glass substrate (not shown in the drawing) into a reactor 3 filled with high pressure fluorine. The glass substrate transporting apparatus 1 can load or unload a quartz bracket 2 into or from a plurality of reactors 3.

The glass substrate transporting apparatus 1 includes an electric lift 4 and a holding rack 5 located on the electric lift 4. The electric lift 4 is slidable on a track 6 and movable by users on the track 6. The elevation of the electric lift 4 is adjustable to align the holding rack 5 with the reactors 3 so that the holding rack 5 can be moved into the reactors 3 to load or unload the quartz bracket 2.

The aforesaid conventional glass substrate transporting apparatus 1 is moved manually on the track 6, hence operation speed is slow. Moreover, the number of the reactors 3 accessible by one glass substrate transporting apparatus 1 also is limited. Utilization of the glass substrate transporting apparatus 1 is not desirable, and production yield also is limited and cannot meet mass production requirement.

SUMMARY OF THE INVENTION

Therefore the primary object of the present invention is to provide a glass substrate transporting apparatus operable with more reactors and movable at faster speeds to achieve enhanced performance and improve productivity to meet mass production requirement.

To achieve the foregoing object the glass substrate transporting apparatus according to the invention can load or unload a quartz bracket into or from a plurality of reactors. It includes a track, a carriage, a rotary element and a telescopic fetching rack. The reactors are located at two sides of the track. The carriage has four track wheels movable on the track and a plurality of motors to synchronously drive the four track wheels. The rotary element is located on the carriage. The telescopic fetching rack is located on the rotary element.

Through movement of the carriage on the track and rotation of the rotary element, the position of the telescopic fetching rack can be changed, namely the telescopic fetching rack can sequentially align and enter the reactors to load or unload the quartz bracket.

Thus, through the invention, more reactors can be deployed at two sides of the track to improve utilization efficiency of the glass substrate transporting apparatus. Moreover, the carriage can move quickly on the track via synchronous driving of the motors, hence productivity can be enhanced to meet use requirements.

The foregoing, as well as additional objects, features and advantages of the invention will be more readily apparent from the following detailed description, which proceeds with reference to the accompanying embodiment and drawings. The embodiment merely serves for illustrative purpose and is not the limitation of the invention.

DETAILED DESCRIPTION OF THE PREFERRED EMBODIMENT

Figure 1:
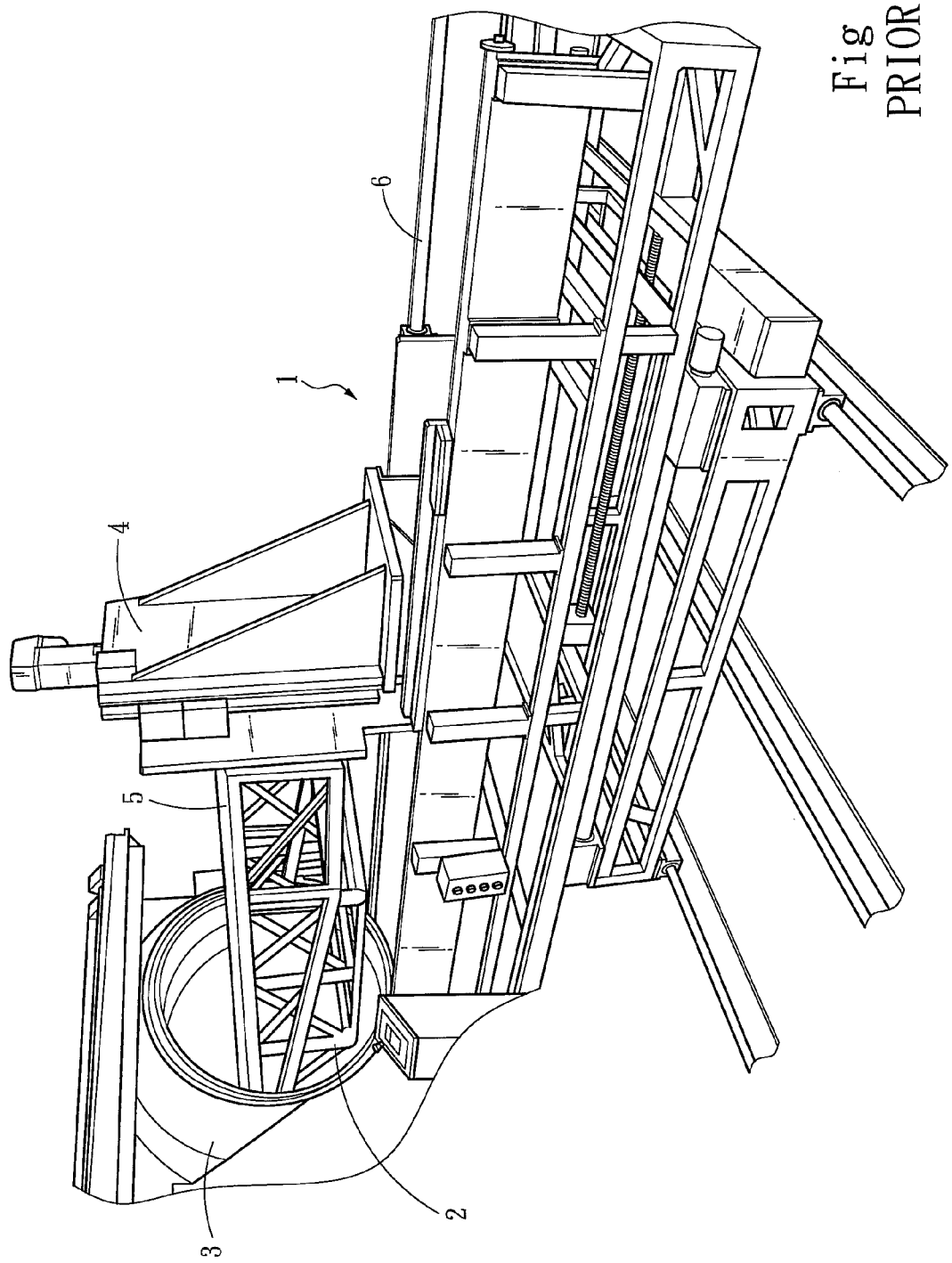
FIG. 1 is a schematic view of the structure of a conventional glass substrate transporting apparatus.
Figure 2:
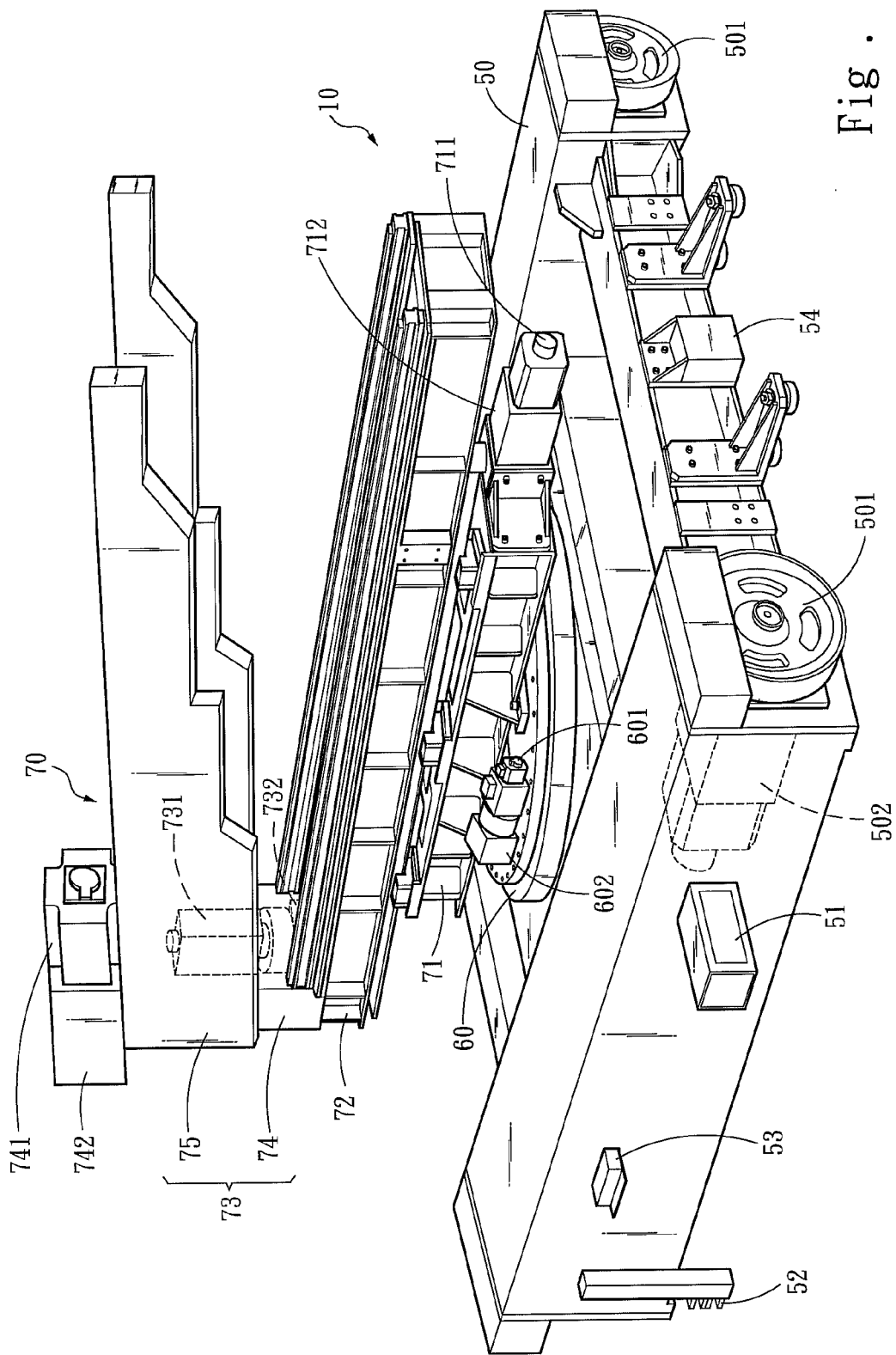
FIG. 2 is a schematic view of the structure of the glass substrate transporting apparatus of the invention.
Figure 3:
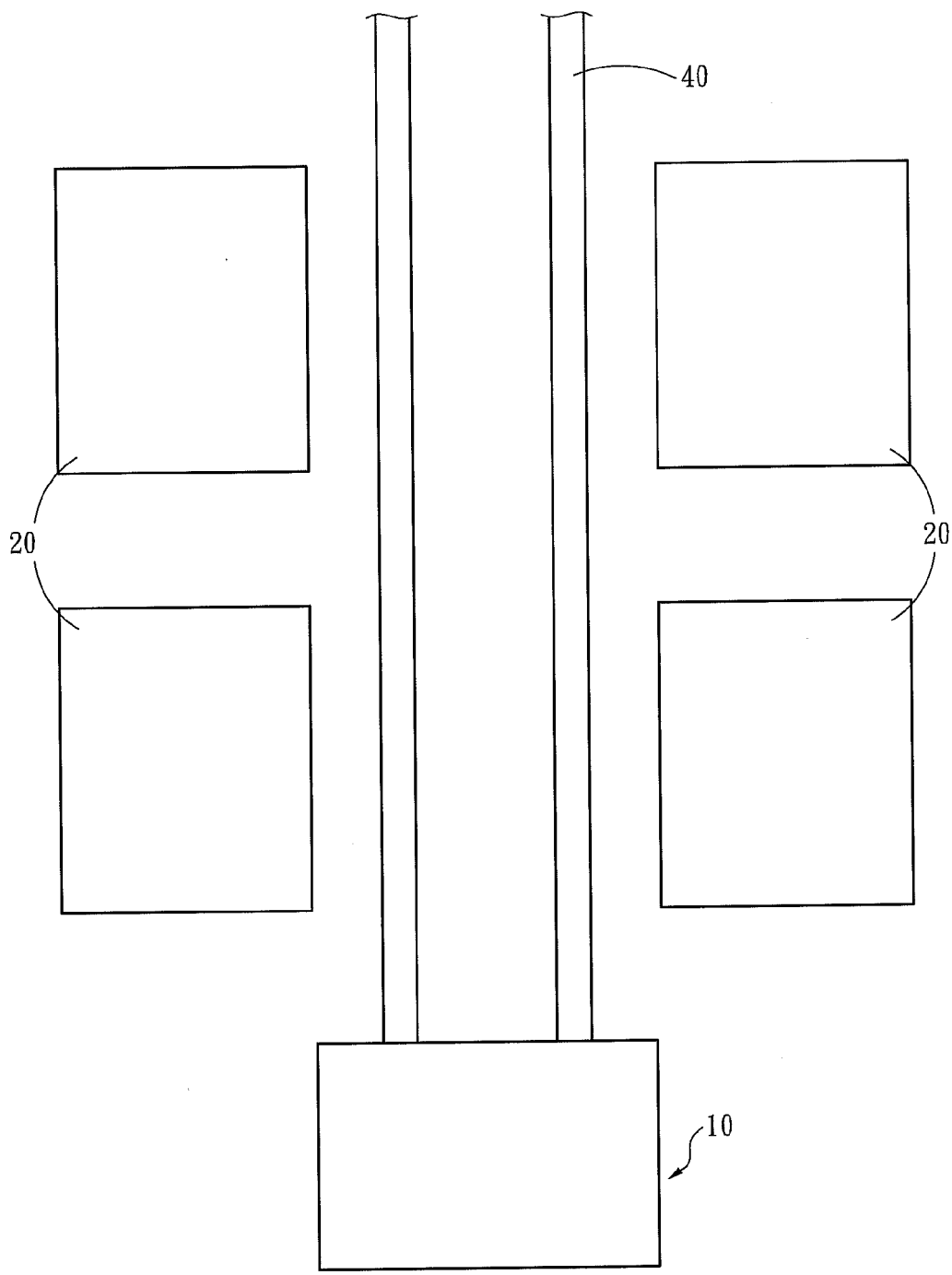
FIG. 3 is a schematic layout of the glass substrate transporting apparatus of the invention.

Please referring to FIGS. 2 and 3, the present invention aims to provide a glass substrate transporting apparatus 10 for loading or unloading a quartz bracket 30 (referring to FIG. 6A) into or from a plurality of reactors 20. It includes a track 40, a carriage 50, a rotary element 60 and a telescopic fetching rack 70. The reactors 20 are located at to sides of the track 40 and each can accommodate loading and unloading of one quartz bracket 30.

The carriage 50 has four track wheels 501 movable on the track 40 and a plurality of motors 502 to drive the four track wheels 501 synchronously. The motors 502 can be four sets to respectively drive the four track wheels 501 synchronously. Thereby the carriage 50 can be moved on the track 40 via the four track wheels 501.

The rotary element 60 is located on the carriage 50 and includes a rotary motor 601 and a rotary gear box 602. The rotary motor 601 drives the rotary element 60 to rotate to correspond to the reactors 20 at different sides via a change drive provided by the rotary gear box 602. The telescopic fetching rack 70 is located on the rotary element 60 and includes a holder 71, a sliding plank 72 and a fetching portion 73 stacked over one another in this order. The holder 71 is anchored on the rotary element 60. The sliding plank 72 is slidably located on the holder 71. The holder 71 further has a sliding motor 711 and a sliding gear box 712. The sliding motor 711 transmits the sliding plank 72 to move linearly against the holder 71 and extend outside the holder 71 via a change drive provided by the sliding gear box 712.

Figure 4:
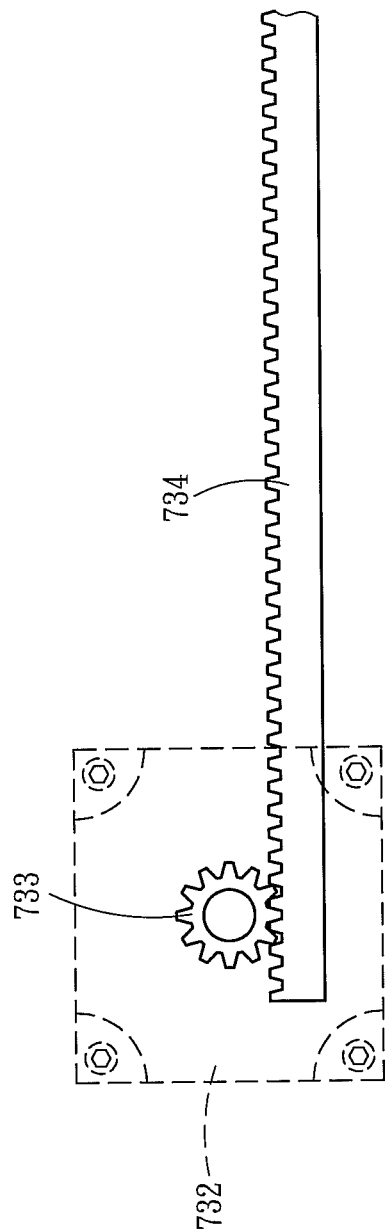
FIG. 4 is a schematic view of the driving structure of the fetching portion of the invention.
Figure 5:
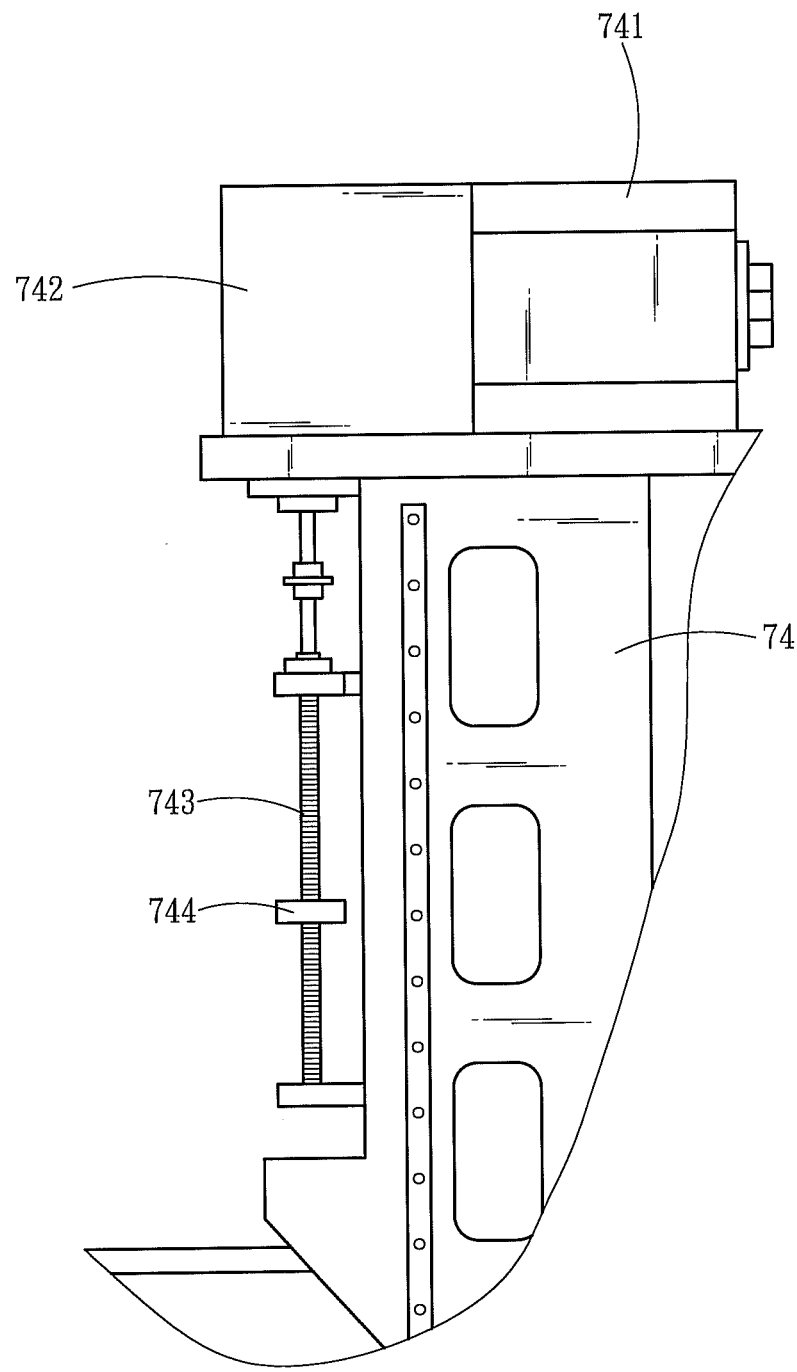
FIG. 5 is a schematic view of the driving structure of the carrying plank of the invention.

Also referring to FIGS. 4 and 5, the fetching portion 73 is slidably located on the sliding plank 72 and has a fetching motor 731 and a gear box 732. The fetching motor 731 transmits the gear box 732. The gear box 732 has a gear 733 engaging with a gear rack 734 such that the fetching portion 73 is movable linearly against the sliding plank 72 to extend outside the sliding plank 72. The fetching portion 73 may include an upright pillar 74 and a carrying plank 75. The sliding plank 72 is slidably located on the upright pillar 74. The carrying plank 75 is slidably located on the upright pillar 74. The upright pillar 74 further has an upright pillar motor 741, an upright pillar gear box 742, a screw bar 743 and a nut 744. The upright pillar motor 741 drives the screw bar 743 via the upright pillar gear box 742, thereby moves the nut 744 on the screw bar 743 to drive the carrying plank 75 to move up and down.

When the fetching portion 73 carries the quartz bracket 30, to prevent excessive deviation of the gravity center of the quartz bracket 30 to result in topping caused by overweight thereof, the carrying plank 75 may carry different weights at different positions in the sliding direction that decrease in proportion to the positions extended outside the sliding plank 72. In other words, the farer the carrying plank 75 extended outside the sliding plank 72, the lighter the weight on the carrying plank 75. The weight configurations also can be achieved by providing varying thicknesses for the fetching portion 73 in the sliding direction.

The carriage 50 can include an optical communication element 51 communicating with a central control system (not shown in the drawings) for transmitting and receiving signals wirelessly. The carriage 50 may also have a positioning sensor 52 on the outer side of each track wheel 501 to orientate the carriage 50 and align the reactors 20. The carriage 50 further has a safety sensor 53 on a lateral side to detect if there is any obstacle (such as person or object) located on the moving path of the carriage 50, the carriage 50 is stopped. The carriage 50 also can have a movement positioning device 54 to feed back the position of the carriage 50 to improve movement and positioning accuracy.

Figure 6A:
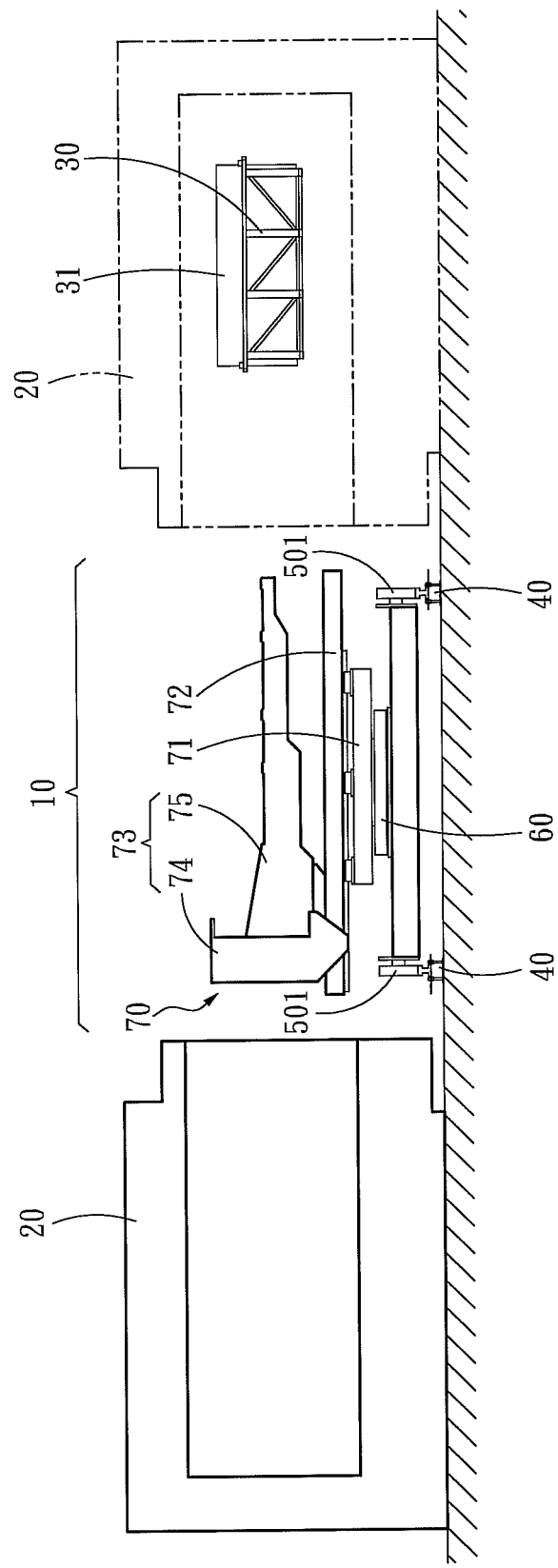
FIGS. 6A through 6D are schematic views of the invention in use conditions.
Figure 6B:
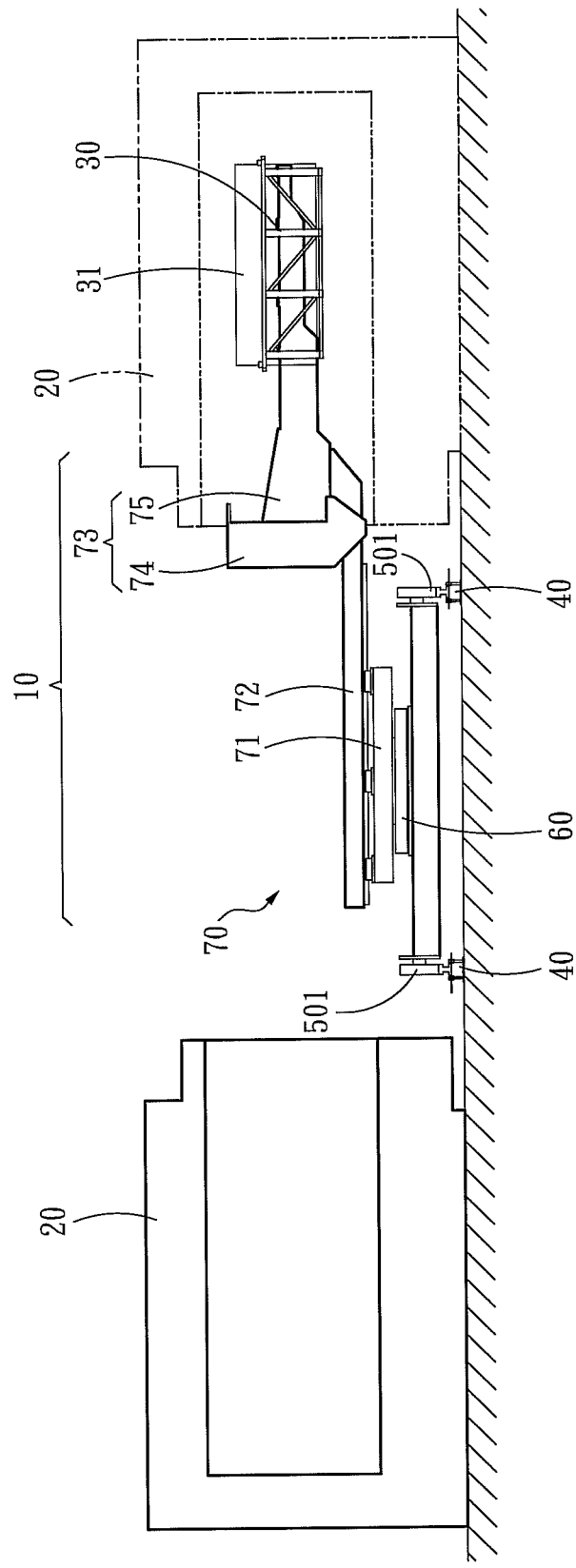
Figure 6C:
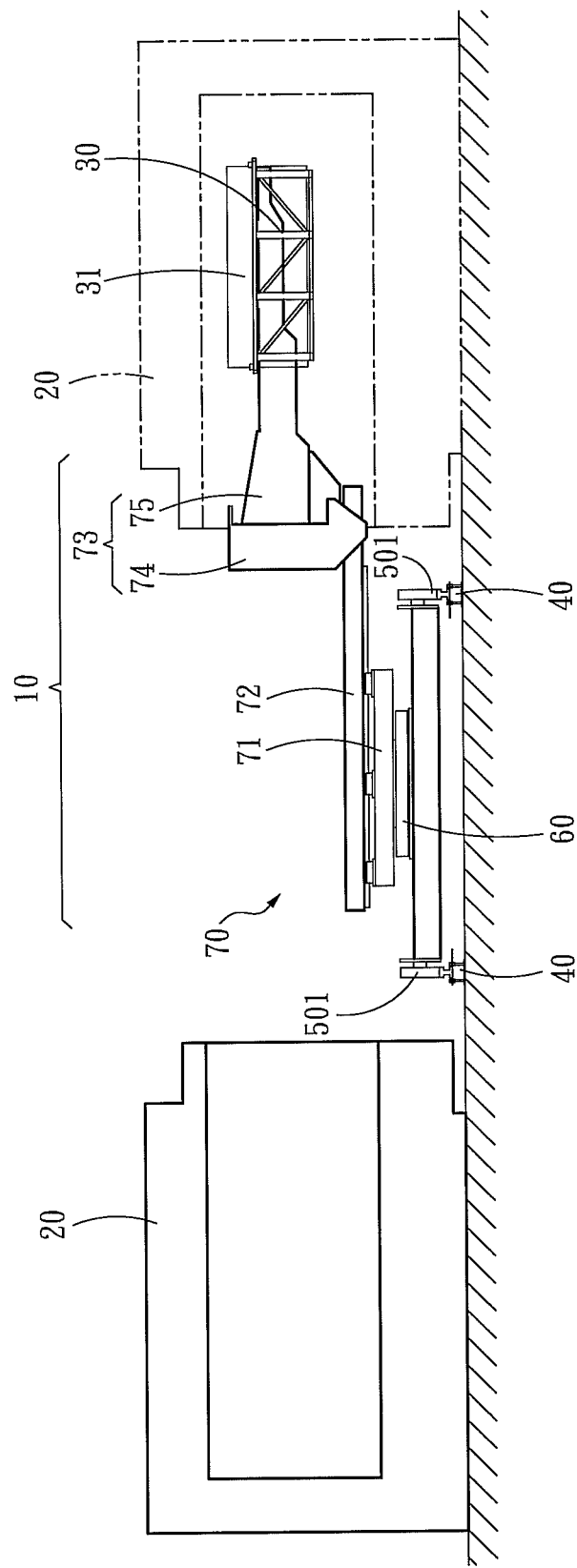
Figure 6D:
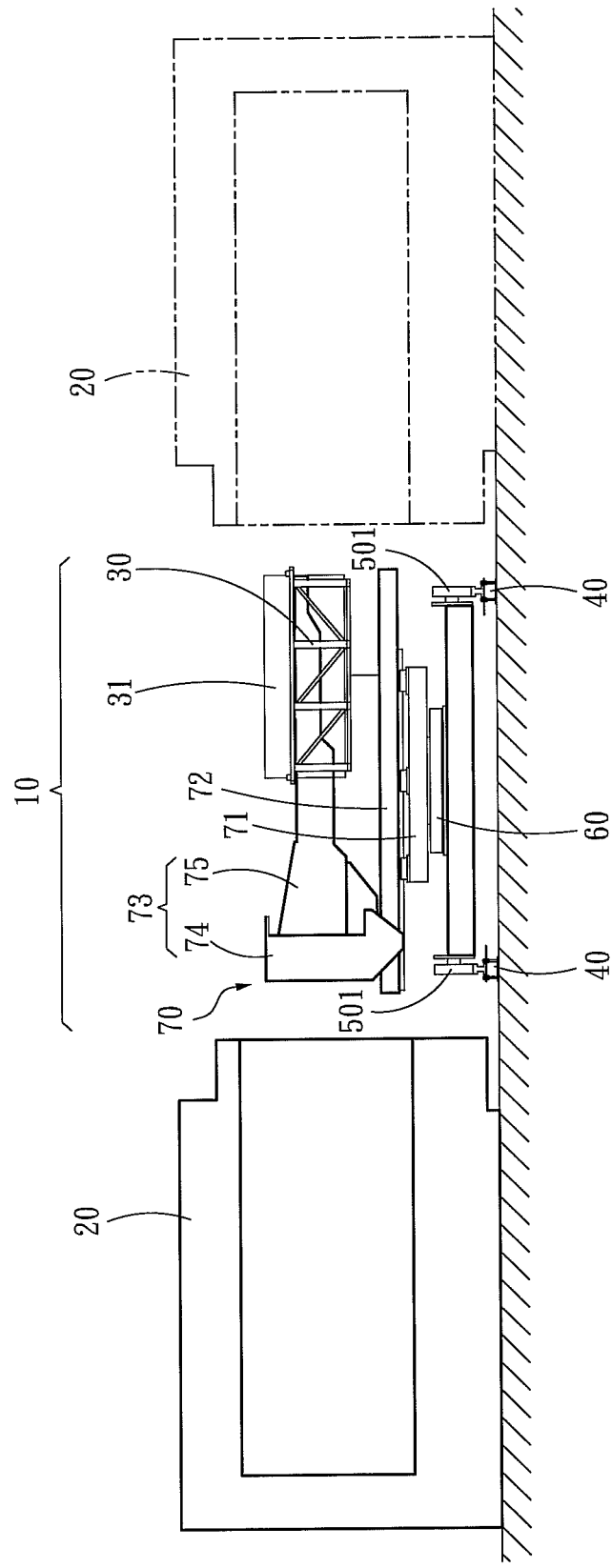

Please refer to FIGS. 6A through 6D for the invention in use conditions, take unloading a quartz bracket 30 holding a glass substrate 31 as an example. First, the glass substrate transporting apparatus 10 is moved along the track 40 in front of a reactor 20 where process is to be performed; the angle of the glass substrate transporting apparatus 10 is adjusted via the rotary element 60 on the carriage 50 to align the reactor 20 (as shown in FIG. 6A); next, the telescopic fetching rack 70 is extended to allow the sliding plank 72 to move against the holder 71 and extend outside the holder 71 so that the fetching portion 73 is moved against the sliding plank 72 and extended outside the sliding plank 72 to enter the reactor 20 below the quartz bracket 30 (referring to FIG. 6B); then the carrying plank 75 of the fetching portion 73 is moved upwards against the upright pillar 74 to carry the quartz bracket 30 (referring to FIG. 6C); finally the telescopic fetching rack 70 is retracted to unload the quartz bracket 30 from the reactor 20 (referring to FIG. 6D).

As a conclusion, the invention allows multiple sets of reactors 20 to be located at two sides of the track 40. By serving more reactors 20 in operation the transporting capability of the glass substrate transporting apparatus 10 can be fully deployed. Moreover, the carriage 50 is movable on the track 40 via synchronous driving of the motors 502, moving speed is faster. As a result, fabrication time can be reduced and productivity improves.

What is claimed is:

1. A glass substrate transporting apparatus for loading or unloading a quartz bracket into or from a plurality of reactors, comprising:
    a track including two sides at which the plurality of reactors are located;
    a carriage including four track wheels movable on the track and a plurality of motors to synchronously drive the four track wheels;
    a rotary element located on the carriage; and
    a telescopic fetching rack located on the rotary element,
    wherein the telescopic fetching rack includes a holder, a sliding plank and a fetching portion stacked over one another in this order, the holder being anchored on the rotary element, the sliding plank being slidably located on the holder and movable linearly against the holder to extend outside the holder, the fetching portion being slidably located on the sliding plank and movable linearly against the sliding plank to extend outside the sliding plank, and
    wherein the holder includes a sliding motor and a sliding gear box, the sliding motor transmitting the sliding plank to move linearly against the holder through a change drive provided by the sliding gear box,
    wherein the fetching portion includes an upright pillar and a carrying plank, the carrying plank being slidably located on the upright pillar, the upright pillar being slidably located on the sliding plank so that the carrying plank is extendable outside the sliding plank, and
    wherein the upright pillar includes an upright pillar motor, an upright pillar gear box, a screw bar and a nut, the upright pillar motor driving the screw bar via the upright pillar gear box such that the nut on the screw bar drives the carrying plank to move up and down.

2. The glass substrate transporting apparatus of claim 1, wherein the rotary element includes a rotary motor and a rotary gear box, the rotary motor transmitting the rotary element to rotate through a change drive provided by the rotary gear box.

3. The glass substrate transporting apparatus of claim 1, wherein the fetching portion includes a fetching motor and a gear box driven by the fetching motor, the gear box including a gear engaging with a gear rack such that the fetching portion is movable linearly against the sliding plank.

4. The glass substrate transporting apparatus of claim 1, wherein the carrying plank carries different weights at different positions in the sliding direction that decrease in proportion to the positions extended outside the sliding plank.

5. The glass substrate transporting apparatus of claim 4, wherein the carrying plank is formed at varying thicknesses in the sliding direction.

6. The glass substrate transporting apparatus of claim 1, wherein the plurality of motors include four sets to respectively drive the four track wheels synchronously.

* * * * *